United States Patent
Hirabayashi

(10) Patent No.: US 6,931,565 B2
(45) Date of Patent: Aug. 16, 2005

(54) SEMICONDUCTOR MEMORY

(75) Inventor: Osamu Hirabayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 535 days.

(21) Appl. No.: 10/077,898

(22) Filed: Feb. 20, 2002

(65) Prior Publication Data

US 2002/0131308 A1 Sep. 19, 2002

(30) Foreign Application Priority Data

Mar. 16, 2001 (JP) ..................................... P2001-075950

(51) Int. Cl.$^7$ ............................................... G06F 11/00
(52) U.S. Cl. ......................................... 714/4; 714/822
(58) Field of Search ............................... 714/42, 822, 4

(56) References Cited

U.S. PATENT DOCUMENTS 3,703,706 A * 11/1972 Ogura et al. ............... 714/822
4,245,212 A * 1/1981 Cirimele .................... 340/825.53
4,653,055 A * 3/1987 Micic et al. ................. 714/805

OTHER PUBLICATIONS

Pilo, et al., "Design–for–Test Method for Stand–Alone SRAMS at 1Gb/s/pin and Beyond", International Test Conference 2000 Proceedings, pp. 436–443.

* cited by examiner

Primary Examiner—Bryce P. Bonzo
(74) Attorney, Agent, or Firm—Banner & Witcoff, Ltd.

(57) ABSTRACT

A semiconductor memory is configured such that it can be connected with a first and second timing generator. The semiconductor memory includes (a) a first register configured to communicate with a memory array and the first timing generator, to retrieve and to hold first data from the memory array at a first timing, (b) a logic gate configured to communicate with the memory array and the first register, to receive the first data from the first register and second data from the memory array after the first timing, so as to compare the first and second data with each other, so that it can provide a comparison result indicating whether or not the first and second data agree with each other, and (c) a second register configured to communicate with the logic gate and the second timing generator, to retrieve and to hold the comparison result at a second timing.

11 Claims, 9 Drawing Sheets

SEMICONDUCTOR MEMORY

CROSS REFERENCE TO RELATED APPLICATIONS

This application is based upon and claims the benefit of priority from the prior Japanese Patent Application No. 2001-75950 filed on Mar. 16, 2001, the entire contents of which are incorporated herein by reference.

BACKGROUND OF THE INVENTION

1. Field of the Invention

The present invention relates to a semiconductor memory operating in synchronization with an external clock signal.

2. Description of the Related Art

Recent high-speed microprocessors require high-speed semiconductor memory, in particular, high-speed static random access memory (SRAM) serving as cache memory. High-speed data transfer between such microprocessors and cache memory takes place at precision timing, and therefore, imposes severe demands on the specifications of skews involved in data output from the memory.

Memory is tested with testers before shipment. The accuracy of the testers is becoming hard to keep pace with the extreme specifications of recent memory. It is difficult for the existing testers to measure the data skews involved in recent memory.

To cope with this problem, Harold Pilo, et al., "DESIGN-FOR-TEST METHODS FOR STAND-ALONE SRAMS AT 1 Gb/s/pin AND BEYOND", International Test Conference 2000 Proceedings, pp. 436–443 has proposed to install a data skew measuring circuit into memory. As shown in FIG. 1, the memory employing such a data skew measuring circuit has a memory core 70 including buffers 71, registers 72, and a memory array 73. Data DQ, an address A, and a command CMD are retrieved and stored in the registers 72 through the buffers 71 in synchronization with a clock signal CK. From the registers 72, the data pieces are transferred to the memory array 73. The data and clock signal are also stored in registers 80 (80a to 80n) in response to a strobe signal STRB generated at predetermined timing. Although the data DQ shown in FIG. 1 is simplified, real data DQ involves a data width of a plurality of bits, which are stored in the registers 80, respectively. The memory includes a boundary scan circuit 90 (IEEE 1149.1). The data pieces stored in the registers 80 are serially read and output through a boundary scan chain of the circuit 90. For example, a data piece held in the register 80m is selected by a selector 91m and is stored in a register 92m. The data piece in the register 92m is transferred to a next register 92n through a selector 91n, and then, is sequentially output through a buffer 93. The circuit 90 is effective in suppressing the chip area of the memory.

FIGS. 2A to 2C show the operation of the circuit 90 when measuring data skews. Two data pieces DQ1 and DQ2 are shown in FIGS. 2A to 2C as examples. The data piece DQ1 is supplied to the register 80m and the data piece DQ2 to the register 80n. Rise timing of the strobe signal STRB is successively swept, and at a rise of the strobe signal STRB, it is checked to see whether data in each register 80 is 0 or 1. Based on results of the checking of the registers 80, skew between the data pieces DQ1 and DQ2 is measured. The strobe signal STRB is shifted step by step. The length of each shifting step can sufficiently be shortened even with a standard tester, and therefore, even the standard tester can measure such a data skew. The "shifting step" is the length of an arrow mark B of FIG. 2B, or the difference between the length of an arrow mark C of FIG. 2C and that of the arrow mark B of FIG. 2B. In addition to data, the clock signal CK can be held in one of the registers 80, to measure the time (access time) between the rise of the clock signal and the data output.

The related art mentioned above has some problems. Data pieces such as DQ1 and DQ2 of FIG. 2 involve different rise timings in different clock cycles (operating cycles). The related art, however, measures data skews in only a single operating cycle. It is difficult for the related art to measure data skews in a plurality of operating cycles and find a worst valid time or a worst invalid time.

SUMMARY OF THE INVENTION

According to an aspect of the present invention, a semiconductor memory configured such that it can be connected with a first and second timing generator, the semiconductor memory includes (a) a first register configured to communicate with a memory array and the first timing generator, to retrieve and to hold first data from the memory array at first timing, (b) a logic gate configured to communicate with the memory array and the first register, to receive the first data from the first register and second data from the memory array after the first timing, so as to compare the first and second data with each other, so that it can provide a comparison result indicating whether or not the first and second data agree with each other, and (c) a second register configured to communicate with the logic gate and the second timing generator, to retrieve and to hold the comparison result at second timing.

DETAILED DESCRIPTION OF EMBODIMENTS

Figure 1:
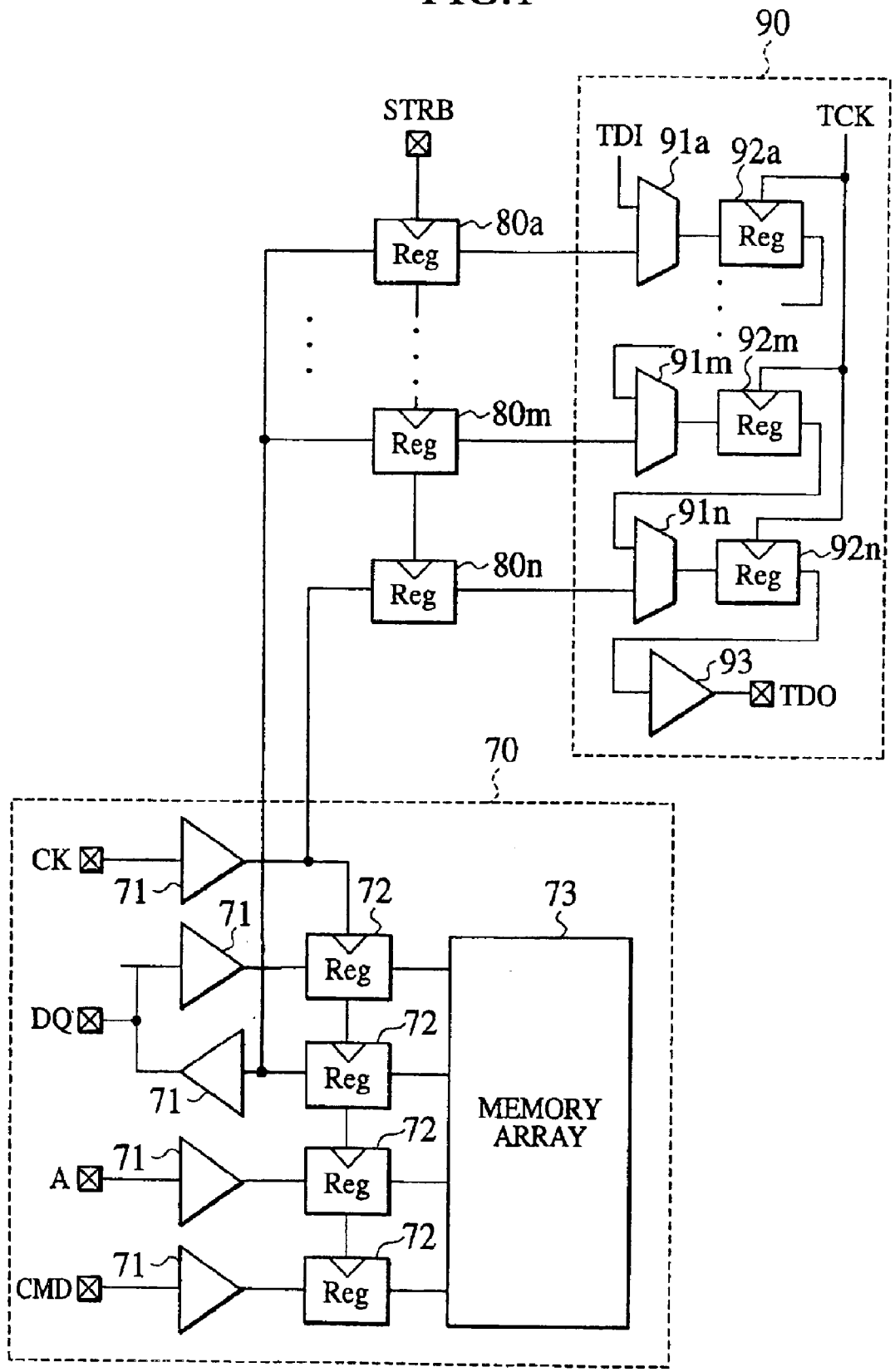
FIG. 1 shows a semiconductor memory having a data skew measuring circuit according to a related art.
Figure 2A:
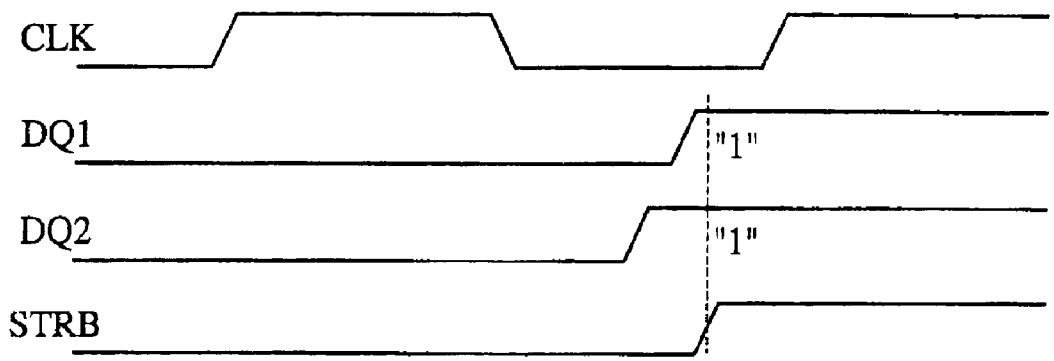
FIGS. 2A to 2C are timing charts showing the operation of the memory of FIG. 1.
Figure 2B:
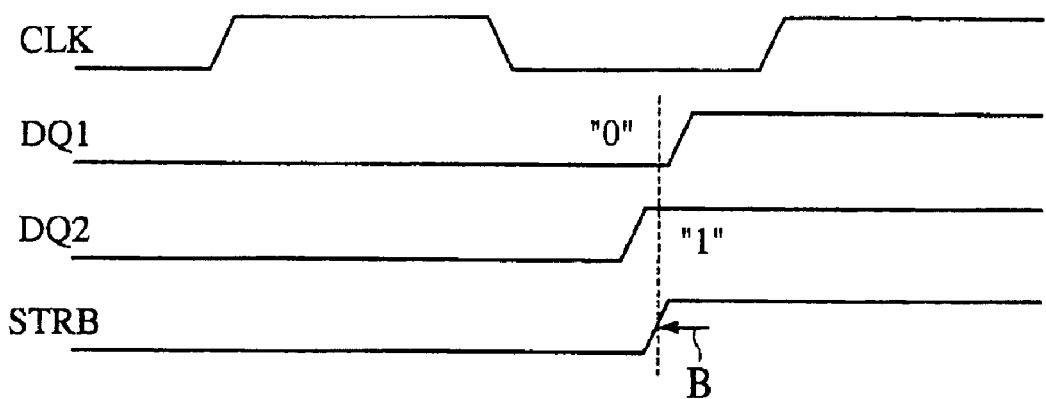
Figure 2C:
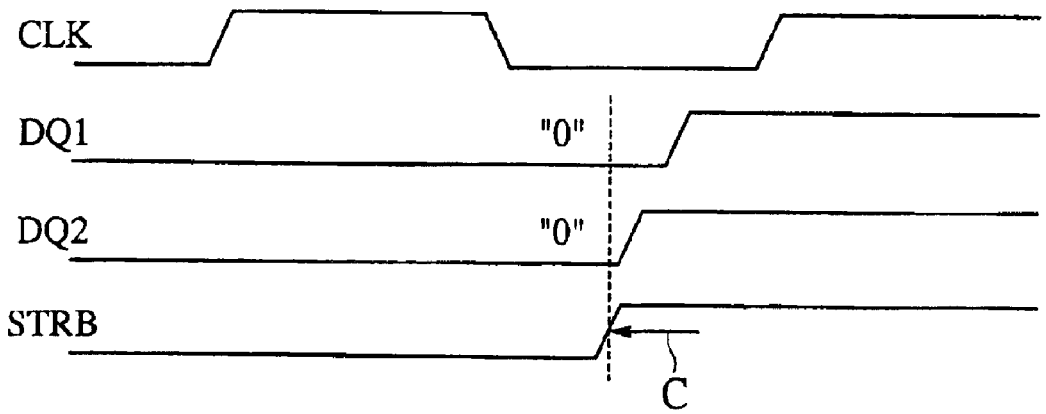

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 3:
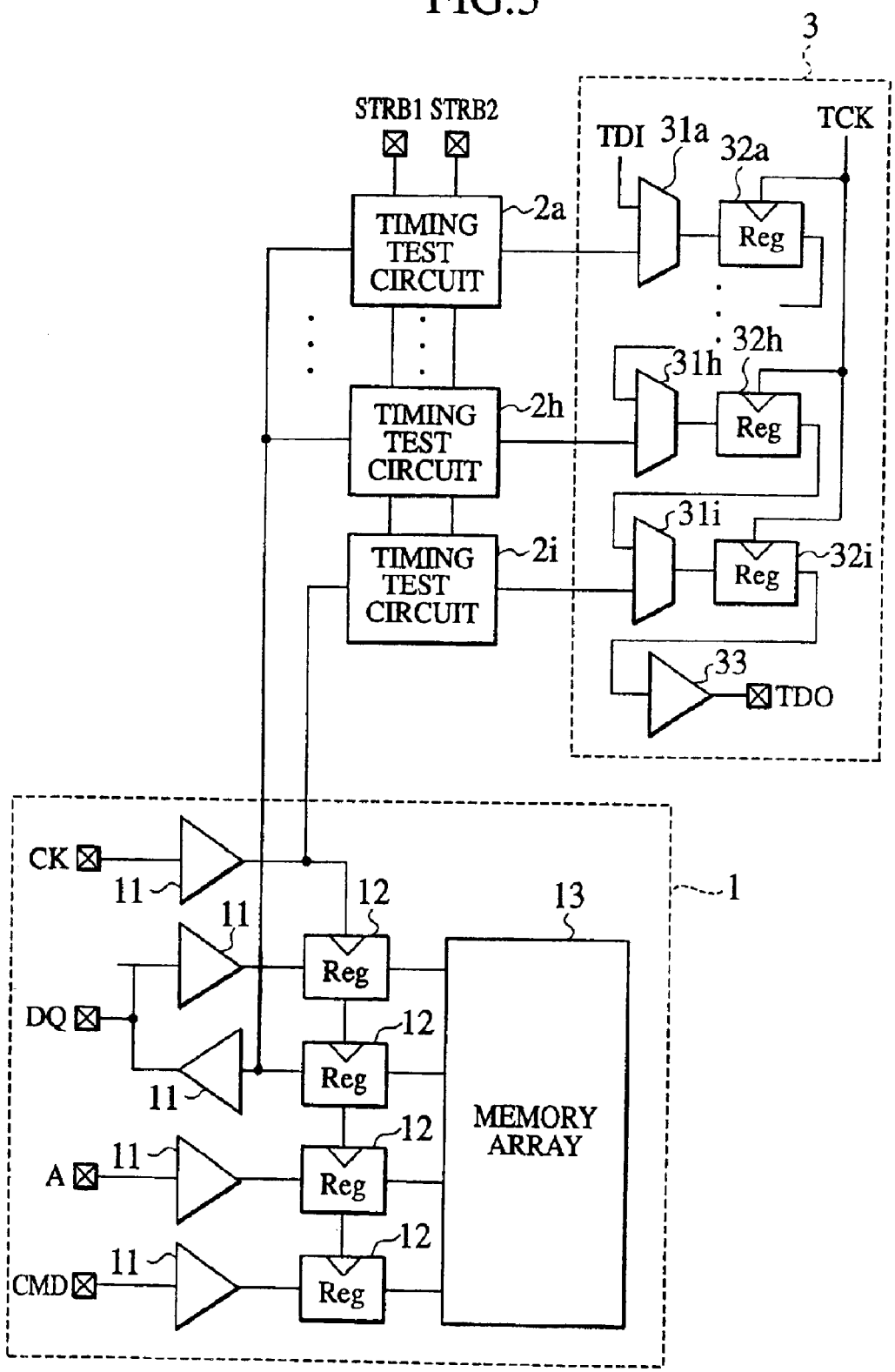
FIG. 3 shows a semiconductor memory according to a first embodiment of the present invention.

As shown in FIG. 3, the memory has a memory core 1, timing test circuit 2 (2a to 2i), and a boundary scan circuit 3. The memory core 1 includes buffers 11, registers 12, and a memory array 13. Data DQ, an address A, and a command CMD are retrieved and held in the registers 12 through the buffers 11 in synchronization with a clock signal CK. The data pieces in the registers 12 are supplied to the memory array 13. The data DQ and clock signal CK are also supplied to the timing test circuit 2. The data DQ in FIG. 3 is simply displayed. In practice, the data DQ has a data width of a plurality of bits, and all of the bits are supplied to the timing test circuit 2. If the data width of the data DQ is eight bits, the lowest bit is supplied to the timing test circuit 2a, the highest bit to the timing test circuit 2h, and the remaining bits are shared respectively by timing test circuit (not shown) between the timing test circuit 2a and 2h.

Outputs of the timing test circuit 2 are serially read and output through a boundary scan chain of the boundary scan circuit 3. The boundary scan circuit 3 has selectors 31 (31a to 31i), registers 32 (32a to 32i), and a buffer 33. Outputs of the timing test circuit 2 are selected by the selectors 31 and are held in the registers 32. A data piece held in a given one of the registers 32 is transferred to the next one of the registers 32 through a corresponding one of the selectors 31 and is sequentially output through the buffer 33. For example, a data piece in the register 32h is transferred to the register 32i through the selector 31i and is output through the buffer 33.

Figure 4:
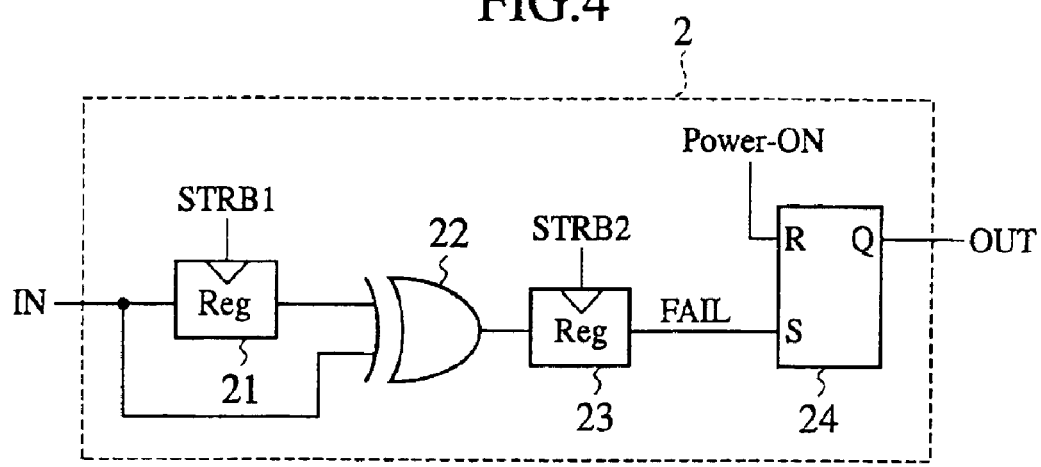
FIG. 4 shows a timing test circuit in the memory of FIG. 3.

As shown in FIG. 4, the timing test circuit 2 has a register 21 (first register) to receive input data IN, an exclusive OR gate 22 (logic gate) to receive the output of the gate 22, a register 23 (second register) and an RS flip-flop (F/F) 24 to receive the output of the register 23. The timing test circuit 2 receives a first strobe signal STRB1 and a second strobe signal STRB2. A rising edge of the first strobe signal STRB1 provides first timing, and a rising edge of the second strobe signal STRB2 provides second timing. The first strobe signal STRB1 serves as a latch signal for the register 21. The second strobe signal STRB2 serves as a latch signal for the register 23. A data piece or the clock signal CK supplied to the timing test circuit 2 is retrieved and held in the register 21 in synchronization with the first strobe signal STRB1. The gate 22 receives input data IN and the output of the register 21 and compares them with each other.

A comparison result from the gate 22 is retrieved and held in the register 23 in synchronization with the second strobe signal STRB2. The output of the register 23 is supplied to the F/F 24. When a power source is turned on, the F/F 24 is reset. Once the output of the register 23 shows a predetermined state, the F/F 24 is set to invert an output Q thereof. Here, the "predetermined state" is, for example, where one input to the gate 22 is 0 and the other input thereto is 1 and, therefore, the output Q of the gate 22 is 1. An output of the F/F 24 may be supplied to a shift register of the boundary scan circuit 3.

Figure 5:
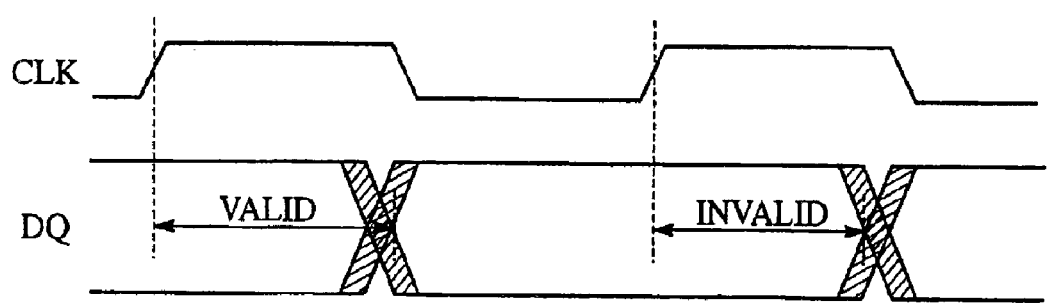
FIG. 5 shows variations in data transition points.

FIG. 5 is a timing chart showing waveforms of data DQ overlapped for a plurality of clock cycles. The level of the data DQ changes at each data transition point. Each data transition point fluctuates as shown in FIG. 5. A "valid time" is the longest period of time from among each of the periods of time measured between the rise of a clock signal CLK and a data defined point. An "invalid time" is the shortest period of time from among the periods of time measured between the rise of the clock signal CLK and a data undefined point. Measuring the valid and invalid times with the timing test circuit 2 of the first embodiment will be explained.

Figure 6:
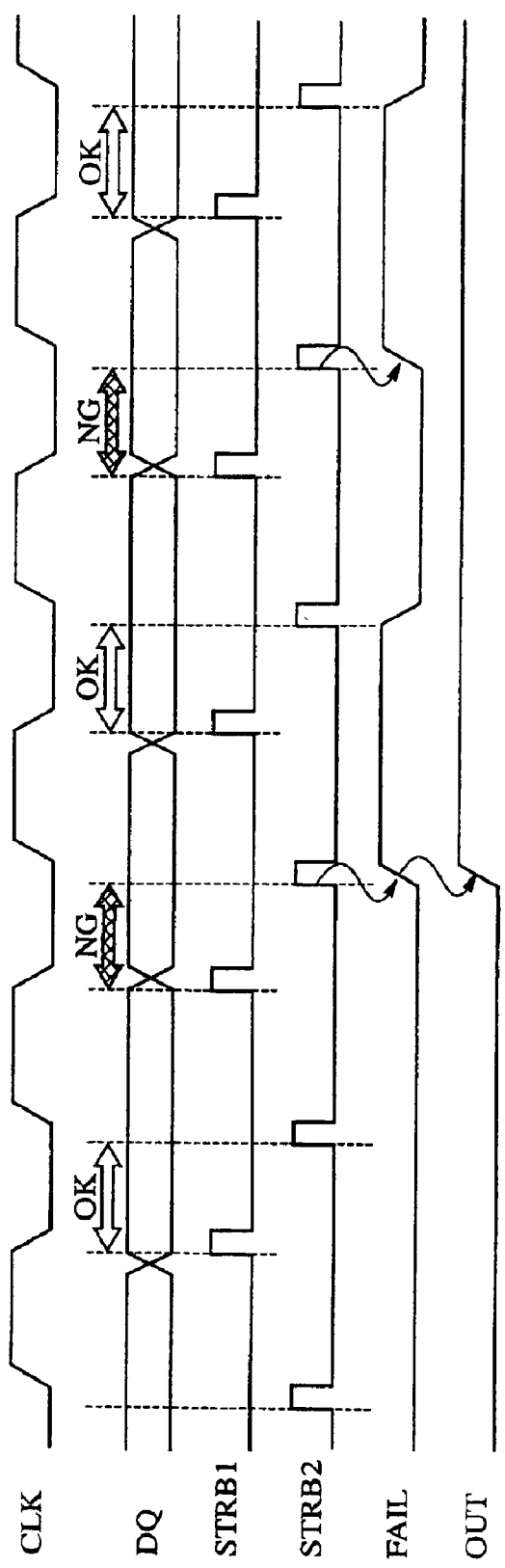
FIG. 6 is a timing chart showing a valid time measuring operation according to the first embodiment.

In each clock cycle of FIG. 6, the first and second strobe signals STRB1 and STRB2 are generated. The timing of a rise of the first strobe signal STRB1 and that of the second strobe signal STRB2 are fixed with respect to the timing of a rise of the clock signal CLK (CK in FIG. 3). A data transition point, however, varies, i.e., it appears earlier or later than a rise of the first strobe signal STRB1. Any data transition point that appears earlier than a rise of the first strobe signal STRB1 is indicated as "OK," and any data transition point that appears later than a rise of the first strobe signal STRB1 is indicated as "NG."

When measuring a valid time, a rise of the second strobe signal STRB2 is fixed at the timing when data is definitely defined. On the other hand, the rise timing of the first strobe signal STRB1 is shifted, measurement by measurement, around a data transition point. FIG. 6 shows one measuring operation, and through one measuring operation, the rise timing of the first strobe signal STRB1 is fixed and is not shifted. Namely, in FIG. 6, the rise timing of the first strobe signal STRB1 is unchanged and data transition points fluctuate around the rise timing of the first strobe signal.

In each timing test circuit 2, a rising edge of the first strobe signal STRB1 provides first timing at which data is retrieved and held in the register 21, and a rising edge of the second strobe signal STRB2 provides second timing. The gate 22 compares the first data from the register 21 with the second data supplied to the logic gate 22 after the first timing and provides a comparison result indicating whether or not the data pieces agree with each other. The comparison result is retrieved and held in the register 23 at the second timing.

Assuming that data has been definitely defined at the second timing, the gate 22 checks to see whether the data was defined at the first timing. If the gate 22 determines that two pieces of data disagree with each other, a fail signal becomes high as indicated at "NG" in FIG. 6. The high-level fail signal is supplied to the F/F 24. Once the high-level fail signal is entered, the F/F 24 is set to provide a fail result. Thereafter, a total test result of the valid time measuring operation is determined.

This measuring operation is repeated by gradually sweeping the rise timing of the first strobe signal STRB1. Namely, the rise timing of the first strobe signal STRB1 is gradually changed with respect to the rise timing of the clock signal CLK. The measuring operation is repeated to find the rise timing of the first strobe signal STRB1 at which no high-level fail signal is generated, and based on the found rise timing of the first strobe signal STRB1, a valid time is obtained.

More precisely, the rise timing of the first strobe signal STRB1 is fixed at a point that is behind the rise timing of the clock signal CLK by a predetermined period. A test is carried out in each of a predetermined number of clock cycles. If a disagreement ("NG" in FIG. 6) is detected in any one of the tests carried out in the predetermined number of clock cycles, the output signal OUT of the F/F 24 becomes high.

Then, the rise timing of the first strobe signal STRB1 is delayed. In FIG. 6, the rise timing of the first strobe signal STRB1 is shifted in a rightward direction away from the rise timing of the clock signal CLK. Again, the test is repeated for a predetermined number of clock cycles. Thereafter, it is determined whether or not a disagreement is observable in any of the tests carried out in the predetermined number of clock cycles.

If a disagreement is observed in any one of the predetermined number of clock cycles even with the delayed first strobe signal, the F/F 24 provides the output signal OUT of high level.

If no disagreement is observed in the predetermined number of clock cycles, the output signal OUT of the F/F 24 will be kept at low level. Then, the period between the rise timing of the clock signal CLK and the rise timing of the first strobe signal STRB1 is measured as a valid time.

For data having a data width of eight bits, all bits from a lowest bit DQ1 to a highest bit DQ8 are simultaneously tested to measure valid times. From among the valid times measured on the data bits DQ1 to DQ8, the longest and shortest are found, and the difference between the longest and shortest valid times is determined as the worst data skew for valid times.

Figure 7:
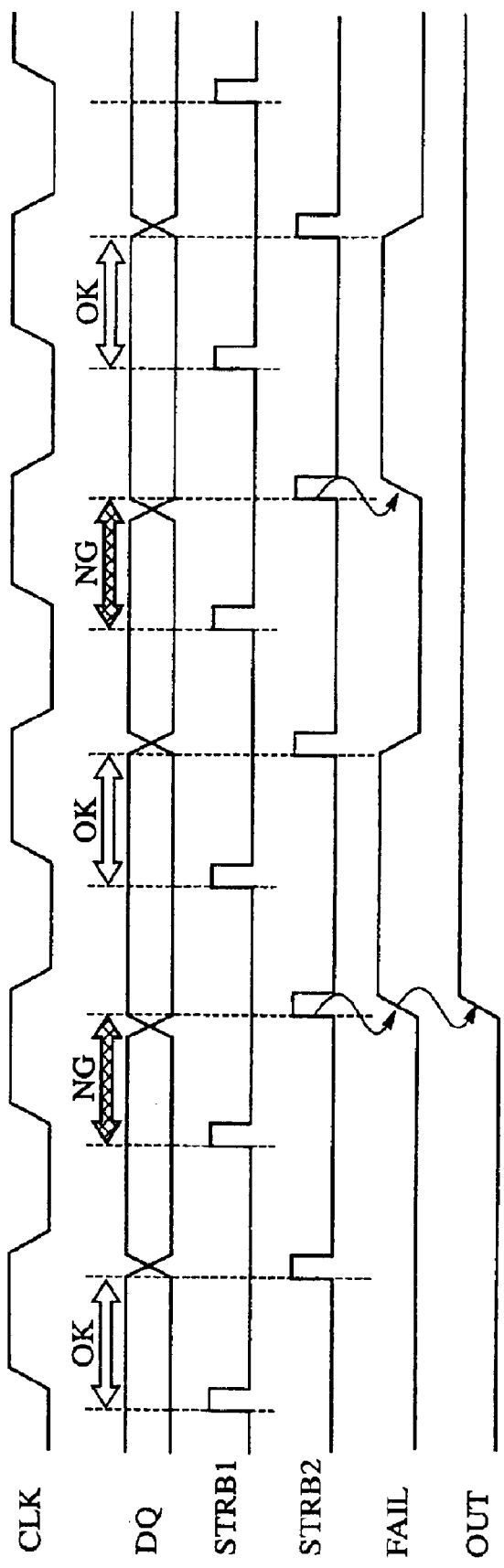
FIG. 7 is a timing chart showing an invalid time measuring operation according to the first embodiment.

As shown in FIG. 7, when measuring an invalid time, the rise timing of the first strobe signal STRB1 is fixed at timing when data is definitely defined. In each timing test circuit 2, the gate 22 compares data that is retrieved and held in the register 21 at the first timing based on the first strobe signal STRB1 with data that is entered into the gate 22 after the first timing, and provides a comparison result indicating whether or not the compared data agree with each other. This comparison result is retrieved and held in the register 23 at the second timing.

Assuming that data is definitely defined at the first timing, the gate 22 checks to see if the data has been defined at the second timing. If the gate 22 determines that two pieces of data disagree with each other, the fail signal becomes high as indicated at "NG" in FIG. 7. The high-level fail signal is supplied to the F/F 24. Once a high-level fail signal is entered, the F/F is set to provide a fail result. This operation is repeated by gradually shifting the rise timing of the second strobe signal STRB2. After the repetitions of the operation to see if there is any high-level fail signal, invalid times are measured, and a skew is found in the invalid times.

In this way, the first embodiment is capable of measuring even a very small data skew that exceeds the measuring accuracy of a tester.

The timing test circuit 2 according to the first embodiment employs the first and second strobe signals to test data at intervals of clock cycles, measure valid and invalid times, and find a worst data skew.

(Second Embodiment)

Figure 8:
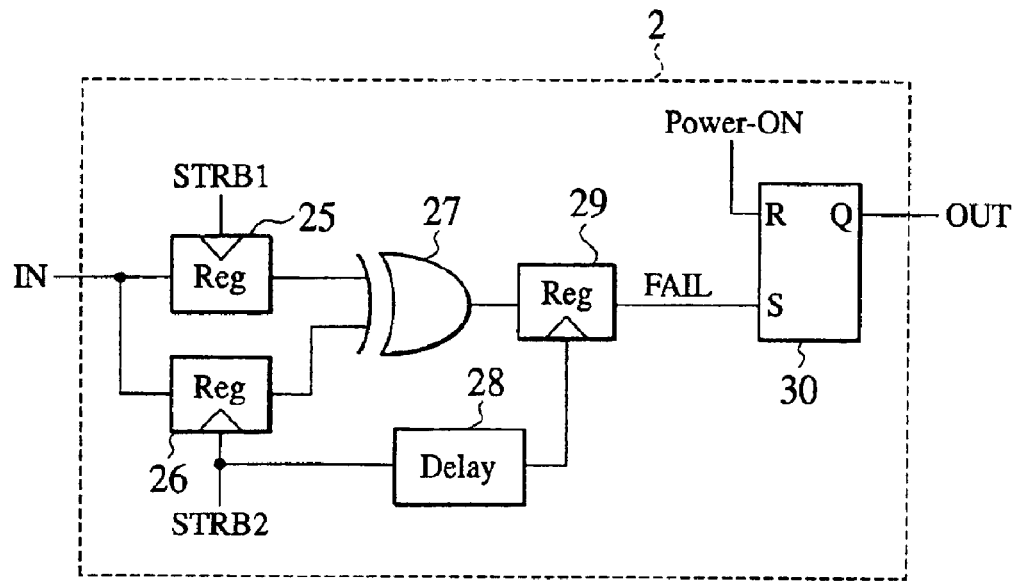
FIG. 8 shows a timing test circuit installed in a semiconductor memory according to a second embodiment of the present invention.

As shown in FIG. 8, the timing test circuit 2 has a register 25 (first register) to retrieve and hold input data IN in synchronization with a first strobe signal STRB1 (first timing); a register 26 (second register) to retrieve and hold input data IN in synchronization with a second strobe signal STRB2 (second timing); an exclusive OR gate 27 (logic gate) to receive the outputs of the registers 25 and 26; a delay circuit 28 to delay the second strobe signal STRB2 so as to generate a third timing; a register 29 (third register) to retrieve and hold the output of the gate 27 in synchronization with the output of the delay circuit 28; and an RS flip-flop (F/F) 30 to receive the output of the register 29. Pulse generating timing of the first and second strobe signals is the same as that in the first embodiment. In comparison with the first embodiment, the second embodiment is characterized in that both of two data pieces to be compared with each other in the gate 27 are temporarily stored in the registers 25 and 26, respectively.

The first embodiment retrieves and holds the output of the gate 22 in synchronization with the second strobe signal STRB2. If data speeds between the input terminals of the gate 22 and the output terminal thereof vary due to manufacturing variations, the measuring accuracy of the first embodiment would be negatively affected.

On the other hand, the second embodiment stores two data pieces in the registers 25 and 26, respectively, and compares them with each other in the gate 27 without being influenced by speed variations in the gate circuit 27.

(Third Embodiment)

Figure 9:
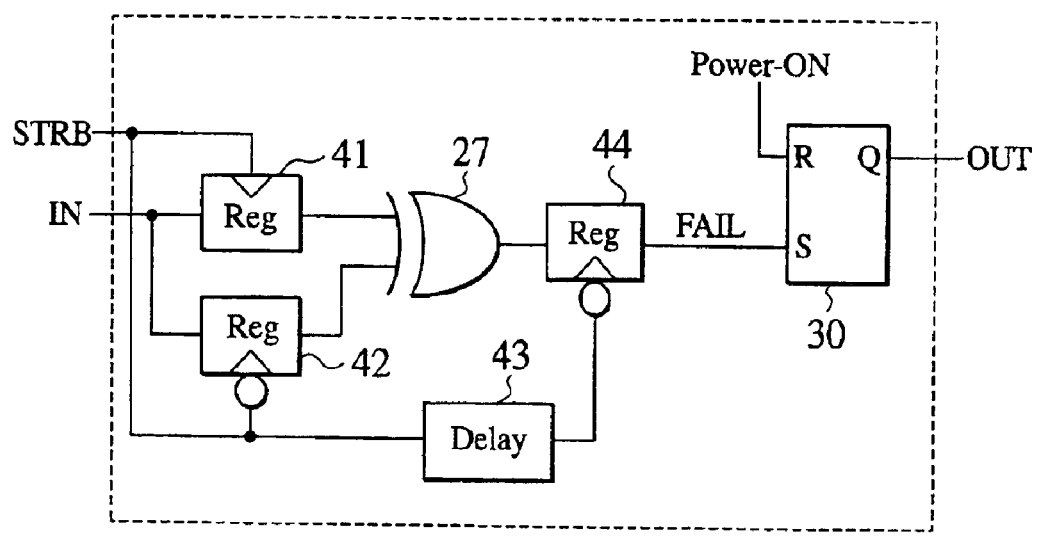
FIG. 9 shows a timing test circuit installed in a semiconductor memory according to a third embodiment of the present invention.

As shown in FIG. 9, the third embodiment is characterized in:

(a) a register 41 is employed to hold data in synchronization with a rising edge of a strobe signal STRB instead of the register 25 of FIG. 8;

(b) a register 42 is employed to hold data in synchronization with a falling edge of the strobe signal STRB instead of the register 26 of FIG. 8;

(c) a delay circuit 43 is employed to delay the strobe signal STRB instead of the delay circuit 28 of FIG. 8; and (d) a register 44 is employed to hold data in synchronization with a falling edge of the output of the delay circuit 43, i.e., the register 44, instead of the register 29 of FIG. 8.

Compared with the second embodiment, the third embodiment is characterized in that a rising edge of the strobe signal STRB functions like the first strobe signal STRB1 of the second embodiment, and a falling edge of the strobe signal STRB functions like the second strobe signal STRB2 of the second embodiment.

Figure 10:
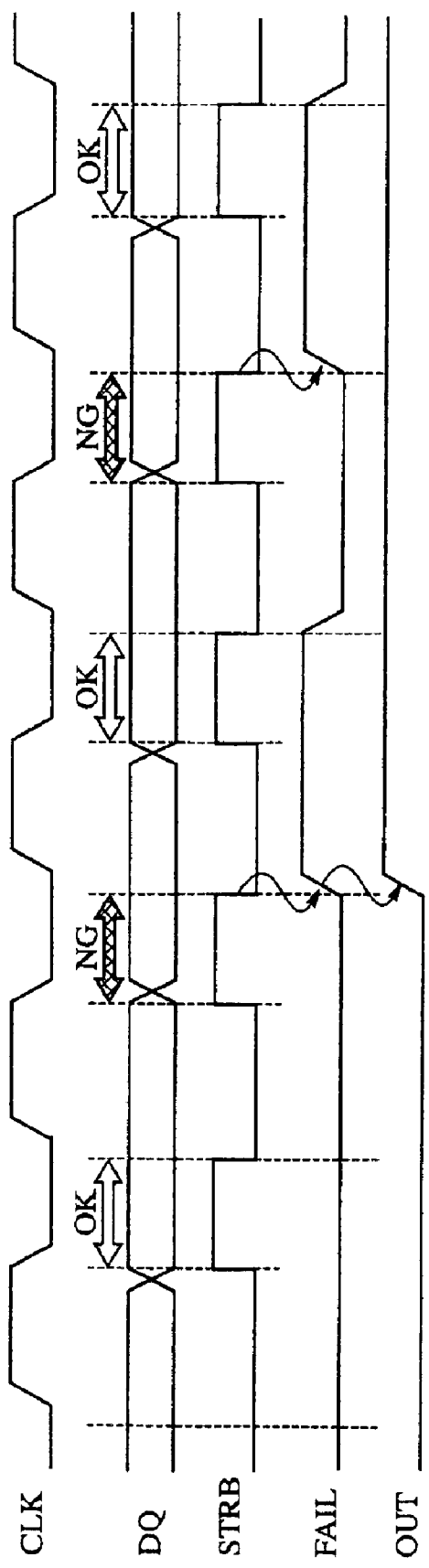
FIG. 10 is a timing chart showing a valid time measuring operation according to the third embodiment.
Figure 11:
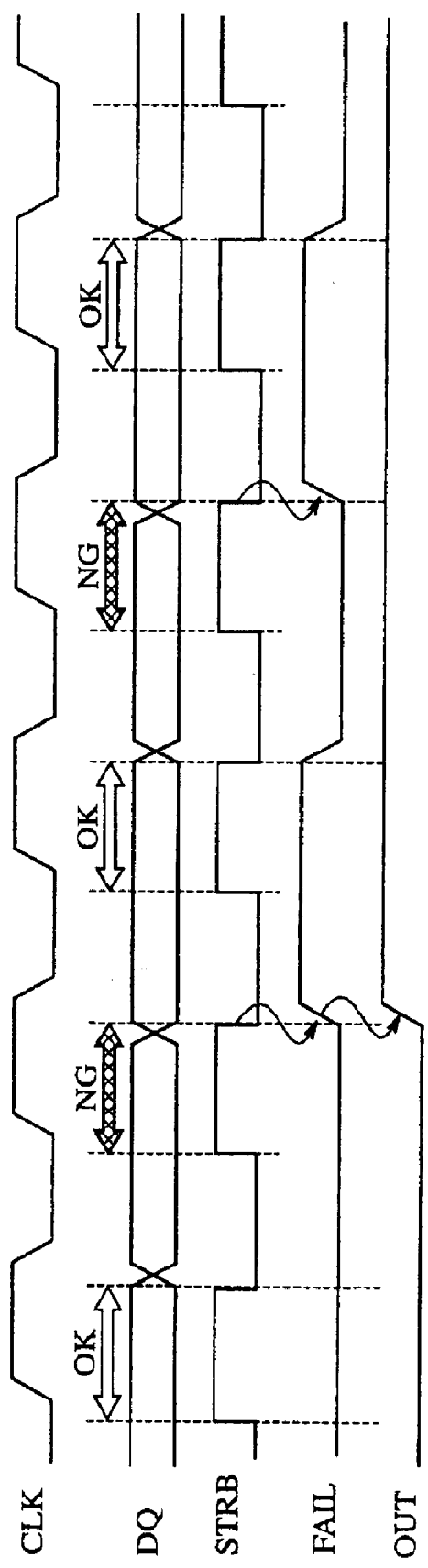
FIG. 11 is a timing chart showing an invalid time measuring operation according to the third embodiment.

As shown in FIGS. 10 and 11, the third embodiment employs rising and falling edges of the single strobe signal STRB to carry out the measuring operations of the second embodiment.

A single strobe signal of the third embodiment provides the same effect as two strobe signals of the second embodiment. Therefore, in comparison with the second embodiment, the third embodiment is compact and simple.

Although the embodiments mentioned above fix the pulse generation timing of one or two strobe signals in each measuring operation and change the pulse generation timing measurement by measurement, this does not limit the present invention. The pulse generation timing of one or two strobe signals may optionally be changed within a single measuring operation.

Any one of the embodiments according to the present invention is capable of measuring a very small data skew exceeding the measuring accuracy of a tester.

The timing test circuit according to any one of the embodiments employs one or two strobe signals as timing signals to test data at intervals of clock cycles, measure valid and invalid times, and find a worst data skew.

The first and second embodiments compare data at the rise of a first strobe signal with data at the rise of a second strobe signal. This does not limit the present invention. For example, data at the fall of the first strobe signal and data at the fall of the second strobe signal may be compared with each other. Alternatively, data at the rise of the first strobe signal and data at the fall of the second strobe signal may be compared with each other. Further, data at the fall of the first strobe signal and data at the rise of the second strobe signal may be compared with each other.

What is claimed is:

1. A semiconductor memory configured such that it can be connected with a first and second timing generator, the semiconductor memory comprising:

a first register configured to communicate with a memory array and the first timing generator, to retrieve and to hold first data from the memory array at a first timing;

a logic gate configured to communicate with the memory array and the first register, to receive the first data from the first register and second data from the memory array after the first timing, so as to compare the first and second data with each other, so that it can provide a comparison result indicating whether or not the first and second data agree with each other; and a second register configured to communicate with the logic gate and the second timing generator, to retrieve and to hold the comparison result at a second timing, both of the first timing and the second timing are within a same clock cycle, but a first amount of phase shift of the first timing is different from a second amount of phase shift of the second timing.

2. The semiconductor memory of claim 1, further comprising a flip-flop circuit configured to communicate with the second register, to receive the comparison result at each clock cycle of a sequence of clock cycles and to hold a data disagreeing state if even one of the comparison results in the second register indicates that the first and second data disagree with each other.

3. The semiconductor memory of claim 2, wherein an output of the flip-flop circuit is supplied to a shift register of a boundary scan circuit.

4. The semiconductor memory of claim 1, wherein:

the first timing is provided when output data is definite; and the second timing is changed at intervals of clock cycles.

5. The semiconductor memory of claim 1, wherein:

the second timing is provided when output data is definite; and the first timing is changed at intervals of clock cycles.

6. The semiconductor memory of claim 1, wherein:

the first timing is provided in response to rising or falling edge of a first strobe signal; and the second timing is provided in response to falling or rising edge of a second strobe signal.

7. The semiconductor memory of claim 1, wherein the first register receives a clock signal instead of the first data.

8. A semiconductor memory configured such that it can be connected with a first and second timing generator, the semiconductor memory comprising:

a first register configured to communicate with a memory array and the first timing generator, to retrieve and to hold first data from the memory array at a first timing;

a second register configured to communicate with the memory array and the second timing generator, to retrieve and to hold second data from the memory array at a second timing, both of the first timing and the second timing are within a same clock cycle, but a first amount of phase shift of the first timing is different from a second amount of phase shift of the second timing;

a delay circuit configured to communicate with the second timing generator, so as to delay the second timing, so that it can provide a third timing;

a logic gate configured to communicate with the first and second register, to receive the first data from the first register and the second data from the second register, so as to compare the received first and second data with each other, so that it can provide a comparison result indicating whether or not the first and second data agree with each other; and a third register configured to communicate with the delay circuit and the logic gate, to retrieve and to hold the comparison result at the third timing.

9. The semiconductor memory of claim 8, further comprising a flip-flop circuit configured to communicate with the third register, to receive the comparison result at each clock cycle of a sequence of clock cycles and to hold a data disagreeing state once the comparison result in the third register indicates that the first and second data disagree with each other.

10. The semiconductor memory of claim 8, wherein:

the first timing is provided in response to rising or falling edge of a first strobe signal; and the second timing is provided in response to falling or rising edge of a second strobe signal.

11. The semiconductor memory of claim 8, wherein:

the first timing is provided in response to a rising edge of a first strobe signal; and the second timing is provided in response to a falling edge of the first strobe signal.

* * * * *